(12) United States Patent
Taniguchi et al.

(10) Patent No.: US 8,576,964 B2
(45) Date of Patent: Nov. 5, 2013

(54) RADIO RECEIVER

(75) Inventors: Kentaro Taniguchi, Kawasaki (JP);
Hirotsugu Kajihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,533

(22) Filed: Mar. 1, 2012

(65) Prior Publication Data
US 2013/0034194 A1 Feb. 7, 2013

(30) Foreign Application Priority Data

Aug. 5, 2011 (JP) ................................. 2011-172149

(51) Int. Cl.
*H04L 27/06* (2006.01)

(52) U.S. Cl.
USPC ........... 375/343; 375/142; 375/143; 375/150; 375/152; 375/260; 375/316; 375/340; 375/354; 327/141; 455/502; 714/707

(58) Field of Classification Search
USPC ......... 375/142, 143, 150, 152, 260, 316, 340, 375/343, 354; 327/141; 455/502; 714/707
See application file for complete search history.

(56) References Cited

U.S. PATENT DOCUMENTS

2011/0150240 A1* 6/2011 Akiyama et al. ................ 381/98

FOREIGN PATENT DOCUMENTS

JP  3251432  3/1996

* cited by examiner

*Primary Examiner* — Leon Flores
(74) *Attorney, Agent, or Firm* — Holtz, Holtz, Goodman & Chick, PC

(57) ABSTRACT

There is provided a radio receiver including: a first matched filter, a second matched filter, a first frame synchronization determining unit and a first phase determining unit. The first matched filter performs matching processing on the basis of N first tap coefficients and sign information of a received digital signal to obtain first output data. The second matched filter performs matching processing on the basis of M (M is a natural number smaller than the N) second tap coefficients, the sign information and amplitude information of the received digital to obtain second output data. The first frame synchronization determining unit determines a first frame synchronization timing of the received digital signal on the basis of the first output data. The first phase determining unit determines a first phase amount of the received digital signal on the basis of the second output data and the first frame synchronization timing.

6 Claims, 17 Drawing Sheets

RADIO RECEIVER

CROSS REFERENCE TO RELATED APPLICATIONS

This application is based upon and claims the benefit of priority from the prior Japanese Patent Application No. 2011-172149, filed on Aug. 5, 2011, the entire contents of which are incorporated herein by reference.

FIELD

Embodiments relate to a radio receiver and, for example, to a digital radio receiver in which frame synchronization and frequency synchronization are established using matched filters.

BACKGROUND

In a conventional radio receiver, a processing time is shortened by concurrently performing frame synchronization processing and frequency synchronization processing using a common matched filter.

As described above, in the conventional radio receiver, frame synchronization processing and frequency synchronization processing are realized by a common matched filter. Accordingly, there is the need to adopt a configuration in which the matched filter has both a sufficient number of taps and sufficient bit accuracy. This causes a circuit scale (number of taps·bit accuracy) to become large. That is, there has been the problem that the circuit scale of the matched filter has to be made to meet a stricter condition, either the required accuracy of frequency synchronization or the required accuracy of frame synchronization. There is also the problem of an increase in power consumption associated with circuit scale expansion.

DETAILED DESCRIPTION

According to an embodiment, there is provided a radio receiver including: a first matched filter, a second matched filter, a first frame synchronization determining unit and a first phase determining unit.

The first matched filter performs matching processing on the basis of N (N is a natural number) first tap coefficients and sign information of a received digital signal to obtain first output data.

The second matched filter performs matching processing on the basis of M (M is a natural number smaller than the N) second tap coefficients, the sign information of the received digital signal, and amplitude information of the received digital to obtain second output data.

The first frame synchronization determining unit determines a first frame synchronization timing of the received digital signal on the basis of the first output data.

The first phase determining unit determines a first phase amount of the received digital signal on the basis of the second output data and the first frame synchronization timing.

Embodiments as described below are characterized in that a matched filter having a tap length lengthened for frame synchronization and a matched filter having bit accuracy raised for frequency synchronization are provided separately and the processing timings of the two matched filters are equalized, thereby reducing a processing time while improving synchronization performance, as well as suppressing a circuit scale to the minimum necessary.

Hereinafter, embodiments will be described in detail, while referring to the accompanying drawings.

Embodiment 1

Figure 1:
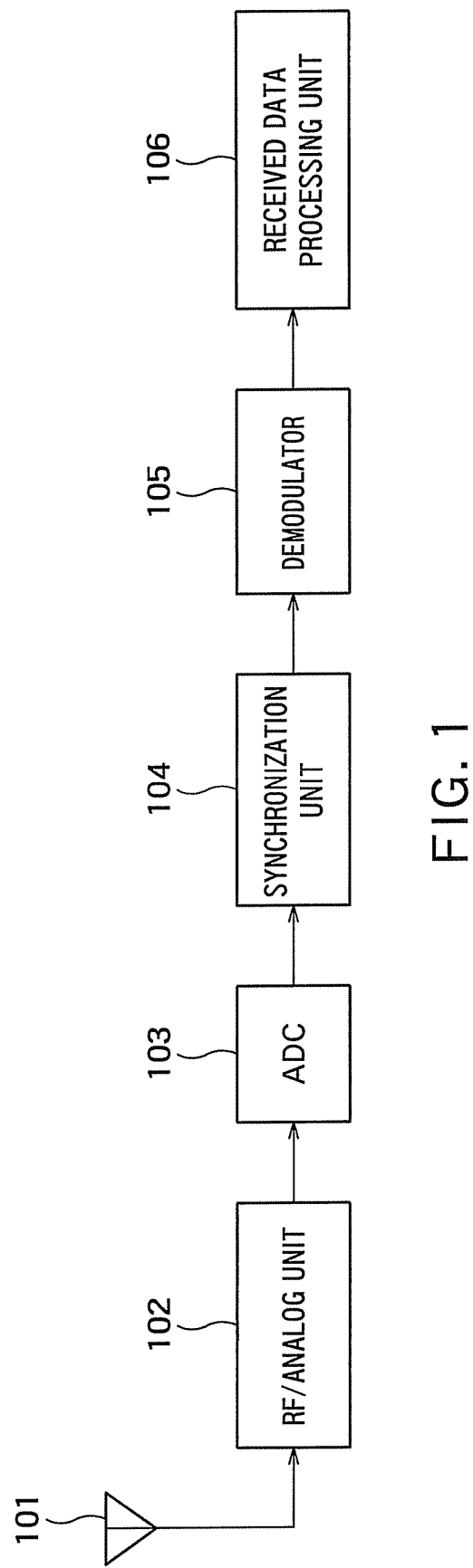
FIG. 1 is a drawing illustrating a configuration example of a terminal radio receiver in a first embodiment.

In Embodiment 1, consideration will be given to an environment in which a framed radio signal is received in various types of communication devices, including a mobile-phone unit. FIG. 1 is a drawing illustrating a configuration example of a wireless terminal for signal reception in Embodiment 1. This wireless terminal includes an antenna 101, an RF/analog unit 102, an ADC (Analog to Digital Converter) 103, a synchronization unit 104, a demodulator 105, and a received data processing unit 106. A high-frequency signal received through the antenna 101 is converted to a desired frequency band at the RF/analog unit 102, and is then converted from an analog signal to a digital signal at the ADC 103. Processing for synchronizing the timings and phases of received signals is performed at the synchronization unit 104. Data symbols are demodulated at the demodulator 105. Decode processing, such as error correction, is performed at the received data processing unit 106 and it is determined whether or not a frame signal can be received.

The present embodiment relates in particular to the processing of the synchronization unit 104 in FIG. 1, and is intended to precisely synchronize the timings and phases of received frame signals by means of a simple circuit configuration using matched filters.

Figure 2:
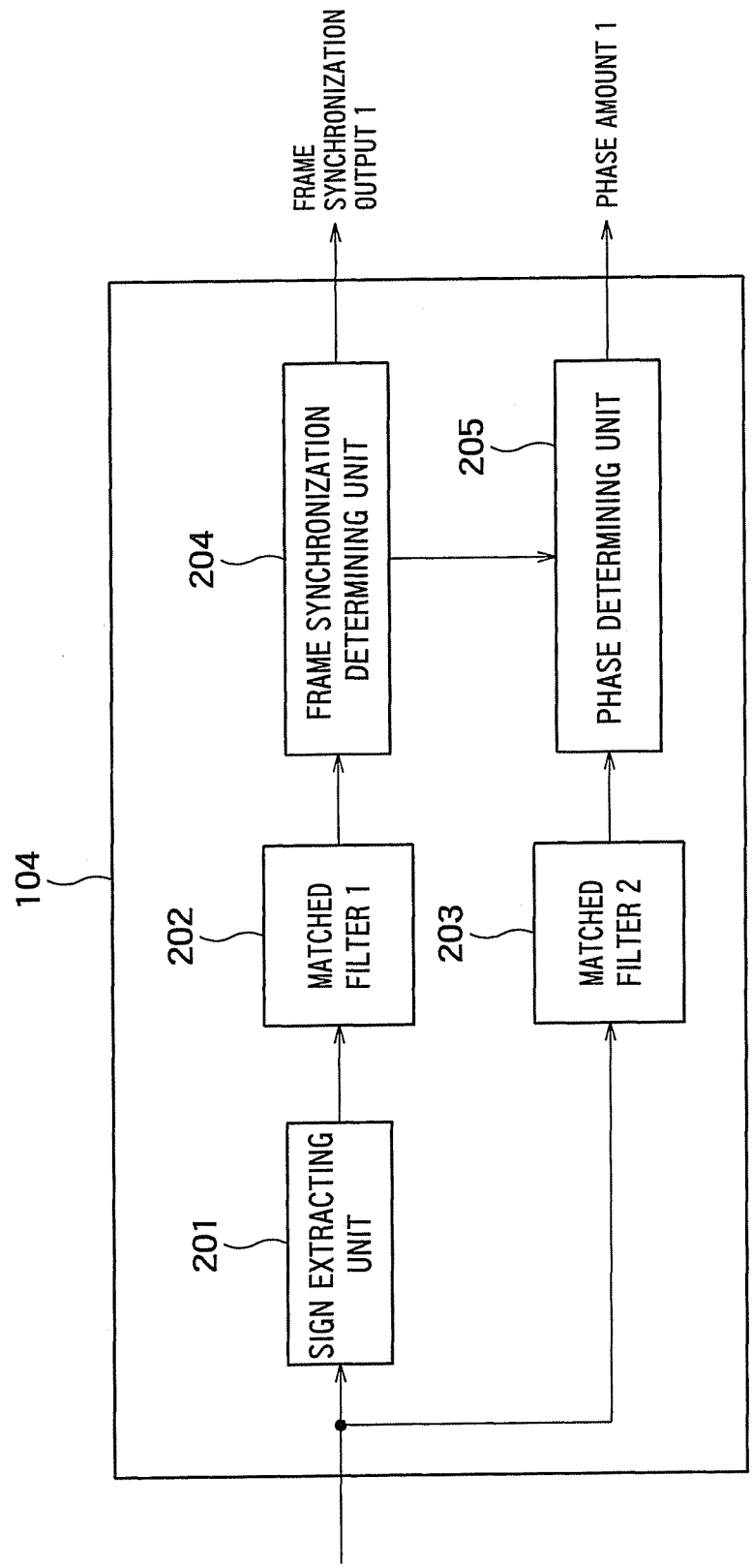
FIG. 2 is a block diagram of a synchronization unit in the first embodiment.

FIG. 2 is a drawing illustrating a basic configuration of the synchronization unit 104. The synchronization unit 104 is provided with a first matched filter 202 for achieving frame synchronization, and a second matched filter 203 for making a phase determination (estimation of phase rotation). In the first matched filter 202, frame synchronization is achieved using only the sign (polarity) information of a received digital signal. In the second matched filter 203, a phase determination is made using both the sign and the amplitude of a received digital signal. A sign extracting unit 201 determines the positive/negative polarity of a received signal and performs processing for inputting sign data to the first matched filter 202. The sign extracting unit can be implemented by a circuit for extracting one MSB bit for each sample of received frame signals.

Figure 3:
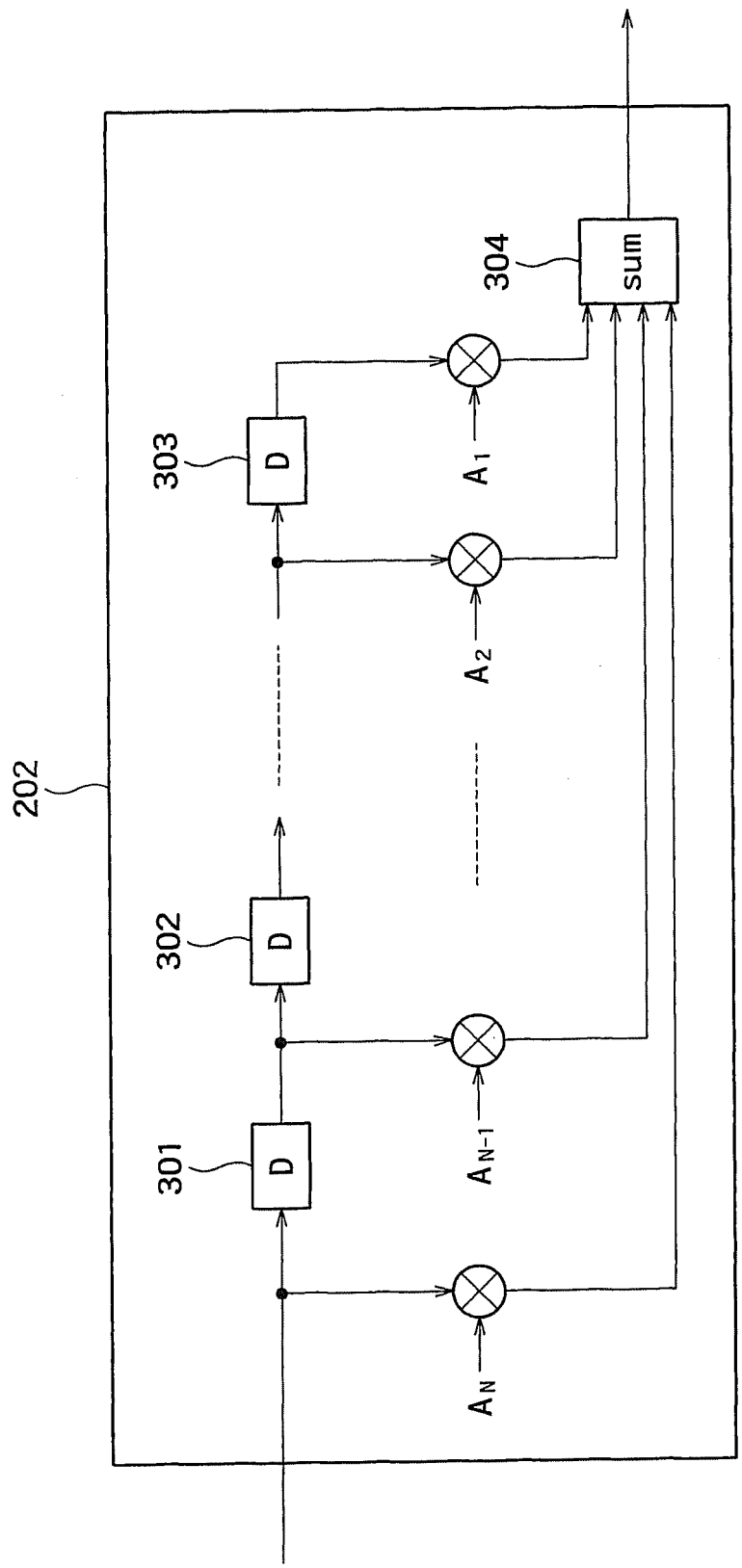
FIG. 3 is a block diagram of a first matched filter in the first embodiment.

The first matched filter 202 is embodied by a circuit configuration illustrated in FIG. 3. The sign data input to the first matched filter 202 passes through delay elements 301 to 303, and a linear sum (correlative value) of the sign data and N (N is a natural number) tap coefficients $A_N$ to $A_1$ is output. The output of the first matched filter 202 corresponds to first output data.

Figure 4:
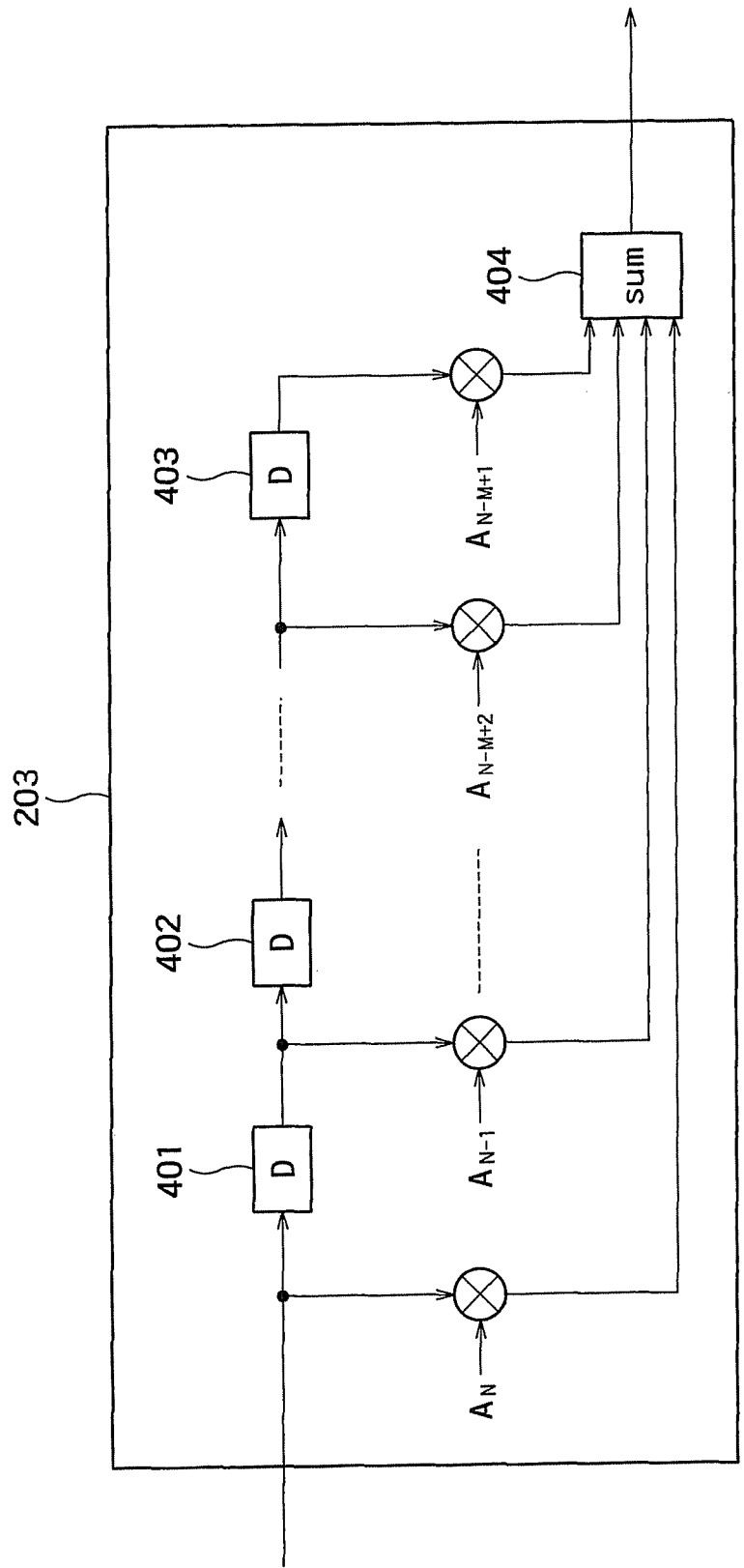
FIG. 4 is a block diagram of a second matched filter in the first the embodiment.

The second matched filter 203 adopts the same configuration and can be embodied by such a circuit as illustrated in FIG. 4. The second matched filter 203 includes M (M is a natural number which satisfies N≥M) tap coefficients $A_N$ to $A_{N-M+1}$, and these tap coefficients constitute a subset of the tap coefficients of the first matched filter 202. The output of the second matched filter 203 corresponds to second output data. The examples cited below show a case in which the number of taps M is smaller than the number of taps N.

Figure 5:
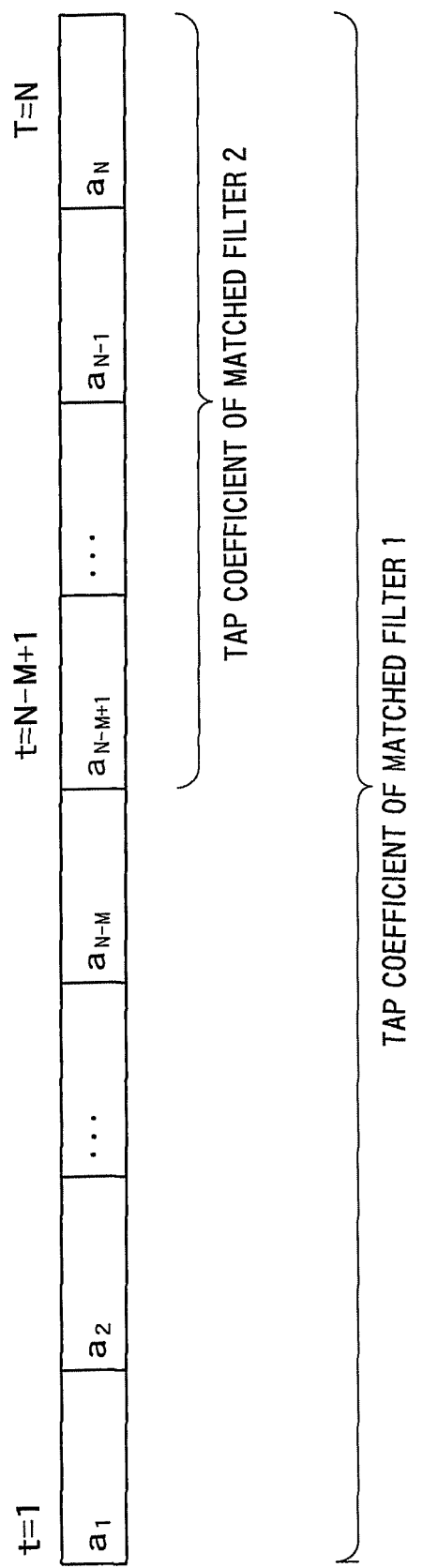
FIG. 5 is a drawing illustrating a relationship between tap coefficients of matched filters and a synchronization word in the first embodiment.

FIG. 5 illustrates a relationship between the tap coefficients of the first and second matched filters. The tap coefficients of the first matched filter 202 agree with known N symbols of a synchronization word, and the tap coefficients of the second matched filter 203 agree with the last M symbols of the abovementioned N symbols of the synchronization word. By setting such tap coefficients as described above, it is possible to equalize matching timings in the first matched filter 202 and the second matched filter 203.

If a timing at which a first symbol $a_1$ of the synchronization word is input to the first matched filter 202 is t=1 in a case where a received frame signal containing the synchronization word $a_1 \ldots a_N$ is input to the synchronization unit 104, the synchronization word is kept input to the first matched filter 202 over a period from t=1 to t=N and matching is reached at t=N. Likewise, a timing at which a significant synchronization word is input to the second matched filter 203 is t=N−M+1. Accordingly, the synchronization word is kept input over a total of M units of time from t=N−M+1 to t=N, and matching is reached at a timing of t=N. Thus, frame synchronization processing and phase determination processing are concurrently performed at the two matched filters to shorten a synchronization processing time.

Figure 6:
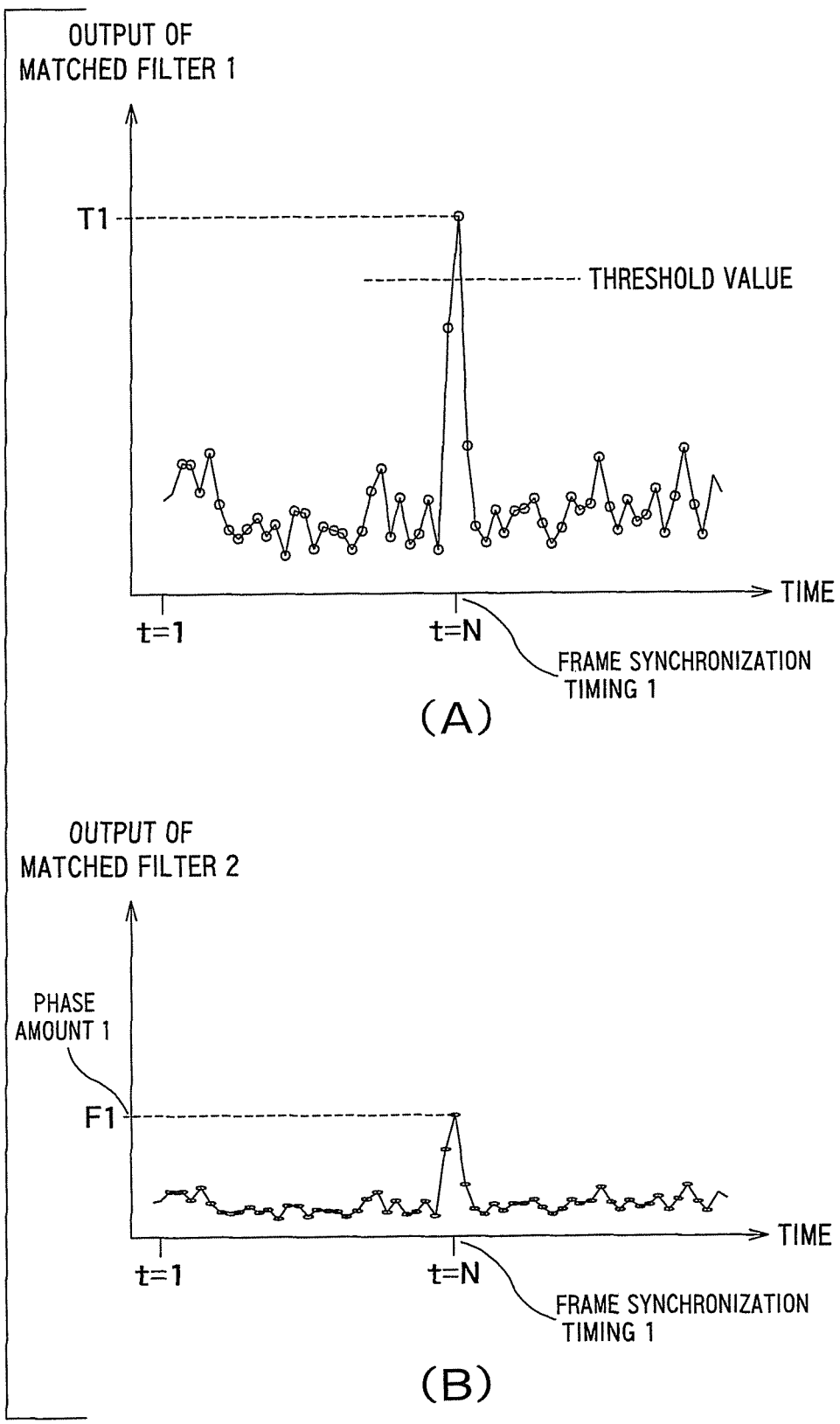
FIG. 6 is a drawing illustrating output examples of matched filters in the first embodiment.
Figure 7:
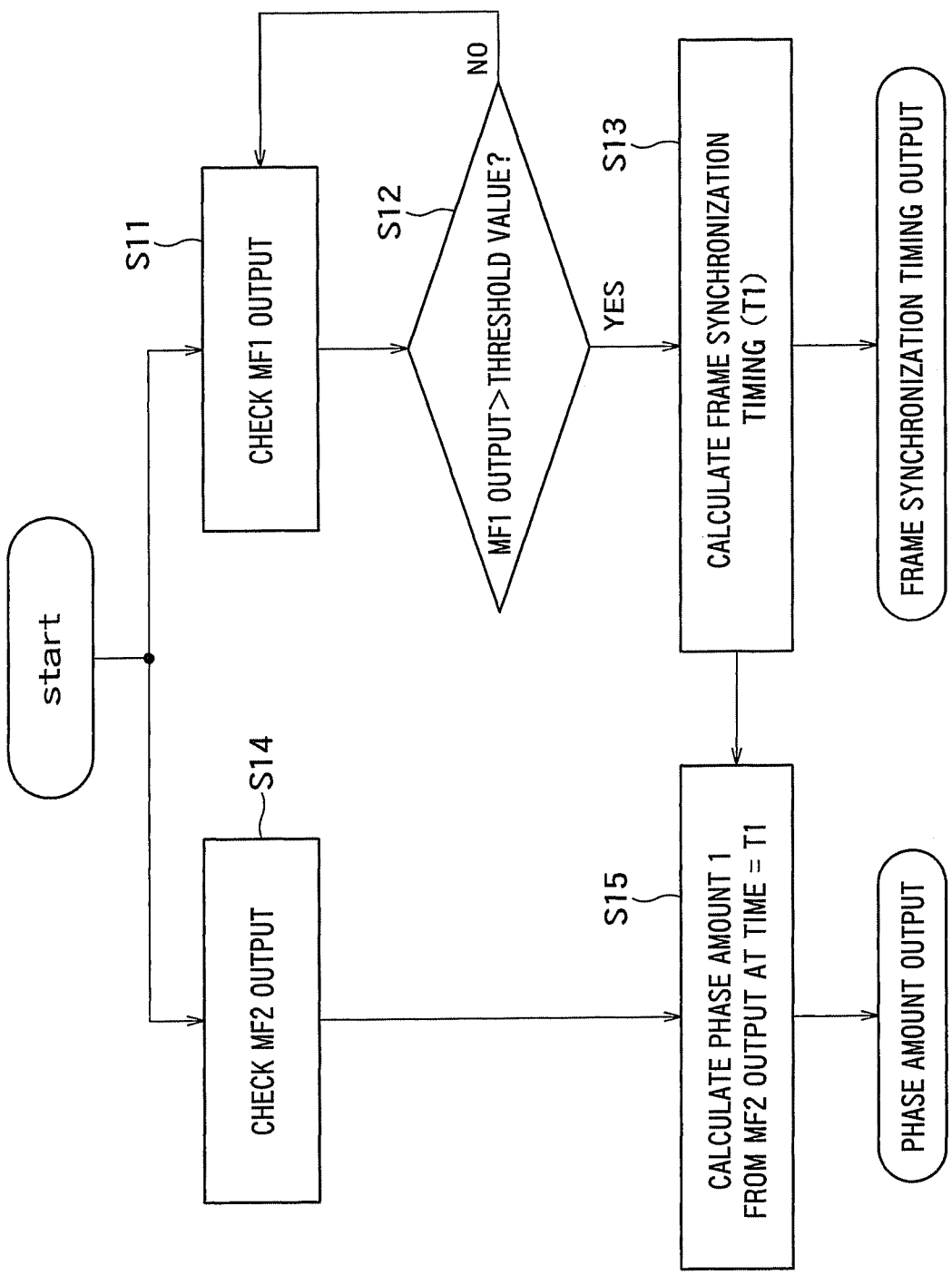
FIG. 7 is a flowchart illustrating the processing of the synchronization unit in the first embodiment.

FIG. 6 illustrates output examples of the first and second matched filters. Both the first and second matched filters match with a synchronization word at t=N and output peaks. However, a larger peak appears in the output of the first matched filter 202 having a longer string of taps. FIG. 7 illustrates a flowchart of frame synchronization timing and phase amount determining processing in the synchronization unit 104. A frame synchronization determining unit 204 observes the output of the first matched filter 202 (S11), captures the timing of a peak exceeding a threshold value (S12), and identifies the frame synchronization timing t=N (S13). A phase determining unit 205 observes the output of the second matched filter 203 (S14), and identifies the phase value arg (F1) of output data F1 at the frame synchronization timing t=N (S15). At this time, the phase determining unit 205 does not try to find the output peak of the second matched filter 203, but receives peak timing information from the frame synchronization determining unit 204. The phase determining unit 205 determines the phase rotation amount of a data, among the output data of the second matched filter 203, at the frame synchronization timing t=N.

The estimated accuracy of the frame synchronization timing in the frame synchronization determining unit 204 depends on the magnitude of a peak appearing in the output of the first matched filter 202. In addition, it is known that a peak at the time of matching is more outstanding in proportion to an increase in the number of taps. On the other hand, the phase determining unit 205 determines the phase of output data at a matching timing of the second matched filter 203. That is, there is the need to precisely know both a timing at which a peak appears and a phase at that time. In a conventional matched filter intended to synchronize both the timing and the phase, the need has been coped with by allowing for sufficient bit accuracy of a received signal and setting a large number of taps. The conventional matched filter has had the problem, however, that a circuit scale expands and power consumption increases.

In the present embodiment, the first matched filter 202 for peak detection is configured to use signs only, and therefore, can be embodied by means of only the addition and subtraction processing of tap coefficients. Thus, it is possible to greatly reduce the circuit scale. In addition, although the second matched filter 203 for phase determination is configured to utilize amplitude information represented by a plurality of bits for phase determination, the circuit scale of the second matched filter 203 is reduced by decreasing the number of taps. Accordingly, it is difficult to detect a matching timing with the output data of the second matched filter 203 alone. It is possible, however, to divert timing information detected with high precision at the frame synchronization determining unit 204, by setting the tap coefficients of the first and second matched filters so that matching timings agree with each other. The advantageous effect of reducing the circuit scale by reducing the number of taps is profound in the case of the second matched filter 203. In addition, effects on reception performance due to the reduction in the number of taps are marginal.

Figure 17:
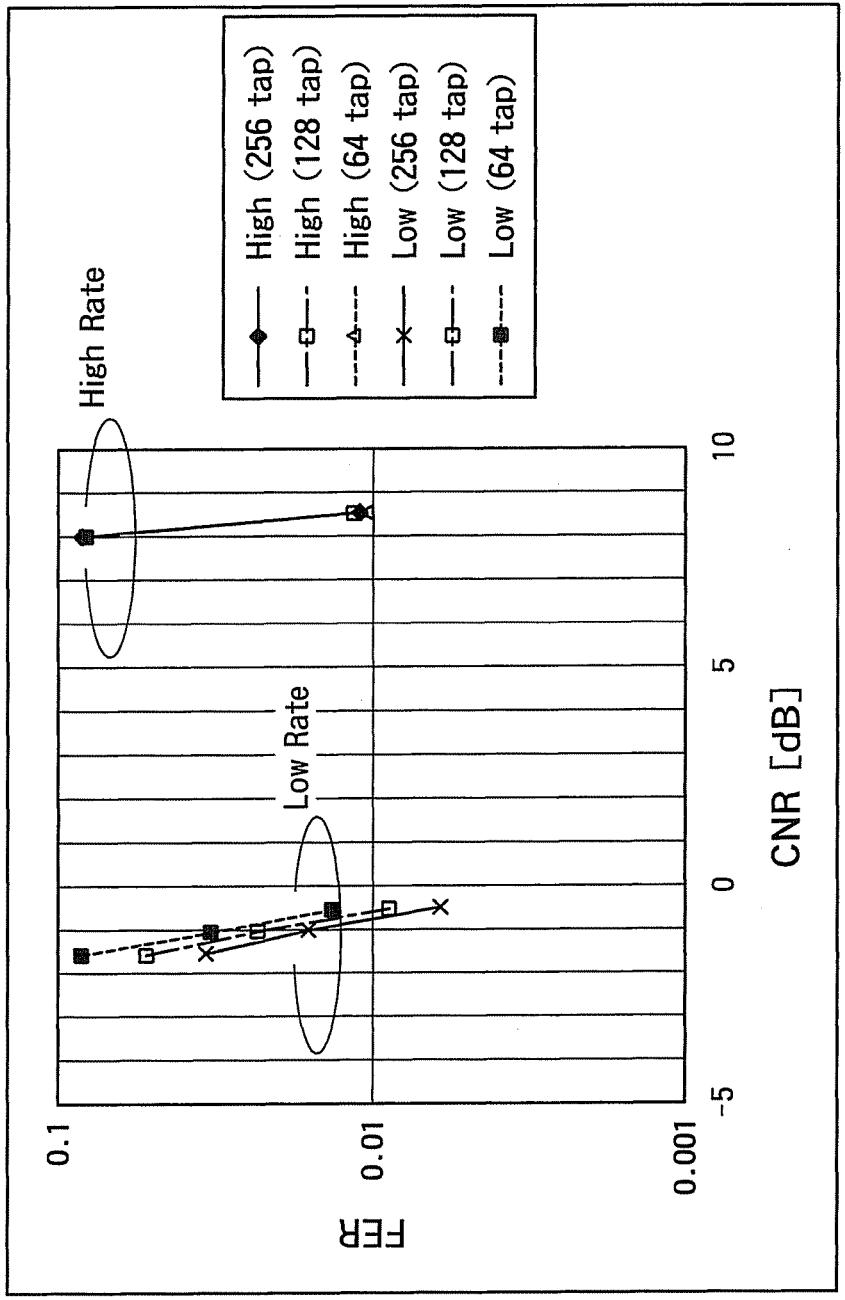
FIG. 17 is a drawing illustrating, by way of example, reception performance when the number of taps of the second matched filter in the first embodiment is varied.

FIG. 17 illustrates, by way of example, reception performance in single-carrier BPSK modulation when the number of taps of the second matched filter 203 is varied. The figure shows two examples of reception performance represented as High Rate and Low Rate. It is understood that in either high-rate performance or low-rate performance, any difference in reception performance due to the difference of phase estimation accuracy is hardly observed even if the number of taps of the second matched filter 203 is varied because a matching timing can be precisely detected by the first matched filter 202.

As described above, in the present embodiment, a radio receiver is provided with a first matched filter for frame synchronization processing and a second matched filter for phase determination separately from each other, and therefore, the respective types of processing can be concurrently performed and a processing time can be shortened. In addition, the circuit scale (number of taps, bit accuracy) of a matched filter can be set individually in accordance with the contents of each type of processing. Thus, it is possible to attain desired frame synchronization performance and phase rotation amount estimation performance with a small circuit scale. Specifically, the circuit scale of the first matched filter can be reduced by configuring the first matched filter so as to use only the sign of a received signal, since frame synchronization performance depends on the number of taps of a matched filter rather than on the bit accuracy thereof. In addition, the circuit scale of the second matched filter can be reduced by configuring the second matched filter so as to use both the sign and amplitude of a received signal and making the number of taps smaller than that of the first matched filter, since phase rotation amount estimation processing depends on the bit accuracy of a matched filter rather than on the number of taps thereof. Yet additionally, it is possible to utilize a frame synchronization timing of the first matched filter having a larger number of taps in phase rotation estimation at the second matched filter. Accordingly, it is possible to raise the estimated accuracy of phase rotation amount.

Note that in the present embodiment, an example has been shown in which the number of taps M of the second matched filter 203 is smaller than the number of taps N of the first matched filter 202. Alternatively, the number of taps M may be the same as the number of taps N. In this case, power consumption can also be reduced as described above by stopping a part of the M taps of the second matched filter 203.

Embodiment 2

Figure 8:
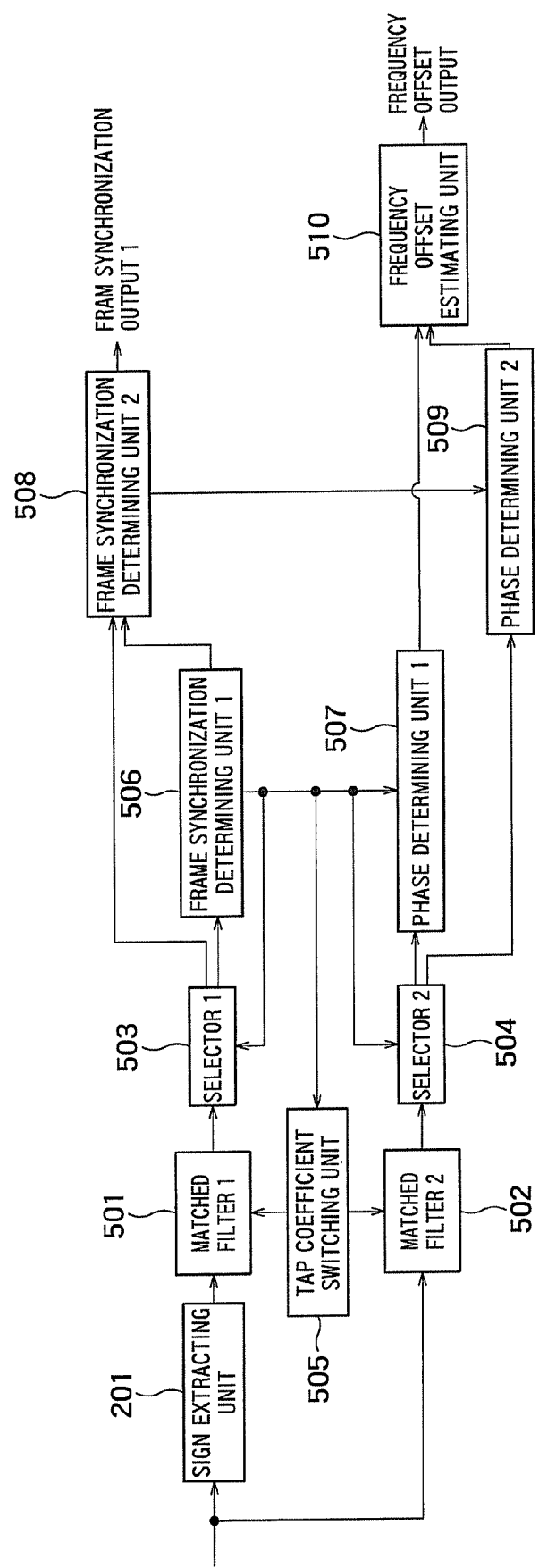
FIG. 8 is a block diagram of a synchronization unit in a second embodiment.

As Embodiment 2, FIG. 8 illustrates a configuration of a synchronization unit provided with a mechanism for estimating a frequency offset which is a time fluctuation of phase shifting. The synchronization unit illustrated in FIG. 8 further includes a tap coefficient switching unit 505, a first selector 503, a second selector 504, a second frame synchronization determining unit 508, a second phase determining unit 509, and a frequency offset estimating unit 510, when compared with the synchronization unit 104 of FIG. 2 which is the first embodiment. Consequently, matching with different synchronization words can be achieved in the respective matched filters by switching over the coefficients of the first matched filter 501 and the second matched filter 502 by the tap coefficient switching unit 505.

Figure 9:
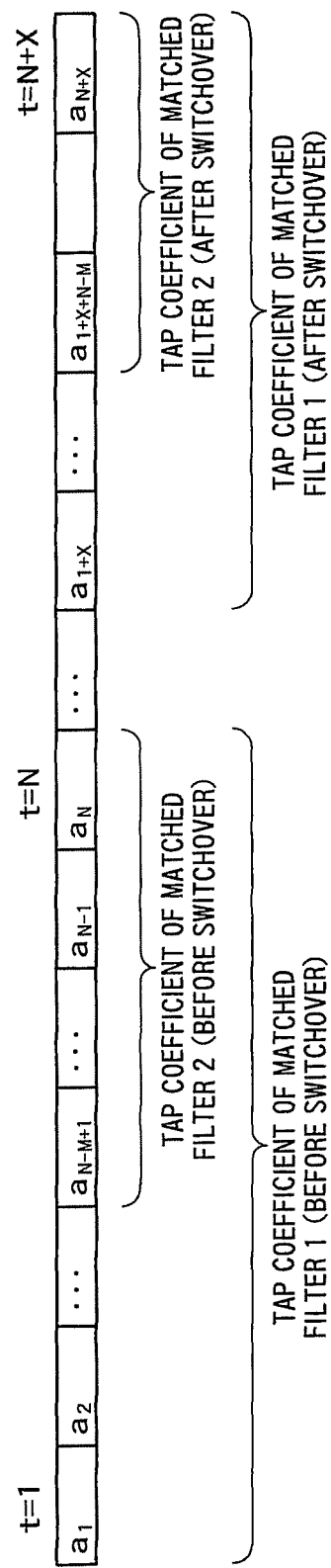
FIG. 9 is a drawing illustrating a relationship between tap coefficients of matched filters and a synchronization word in the second embodiment.

FIG. 9 illustrates a relationship between the tap coefficients of matched filters and synchronization words in the second embodiment. As a preamble signal containing a synchronization word, assume an aperiodic signal having a length of N+X symbols. In the first matched filter 501, tap coefficients are set so as to match with first N symbols and last N symbols. That is, tap coefficients before switchover are $a_N \ldots a_1$, and tap coefficients after switchover are $a_{N+X} \ldots a_{1+X}$. The coefficients of the second matched filter 502 are set to last M taps, among the N taps of the coefficient of the first matched filter. That is, tap coefficients before switchover are $a_N \ldots a_{N-M+1}$, and tap coefficients after switchover are $a_{N+X} \ldots a_{1+X+N-M}$. Thus, timings for output peaks to appear at the time of matching are caused to coincide by equalizing the last symbols of the tap coefficients of the first and second matched filters. Accordingly, phase determination can be performed by diverting the result of determining a frame synchronization timing, as in the case of the first embodiment.

Figure 10:
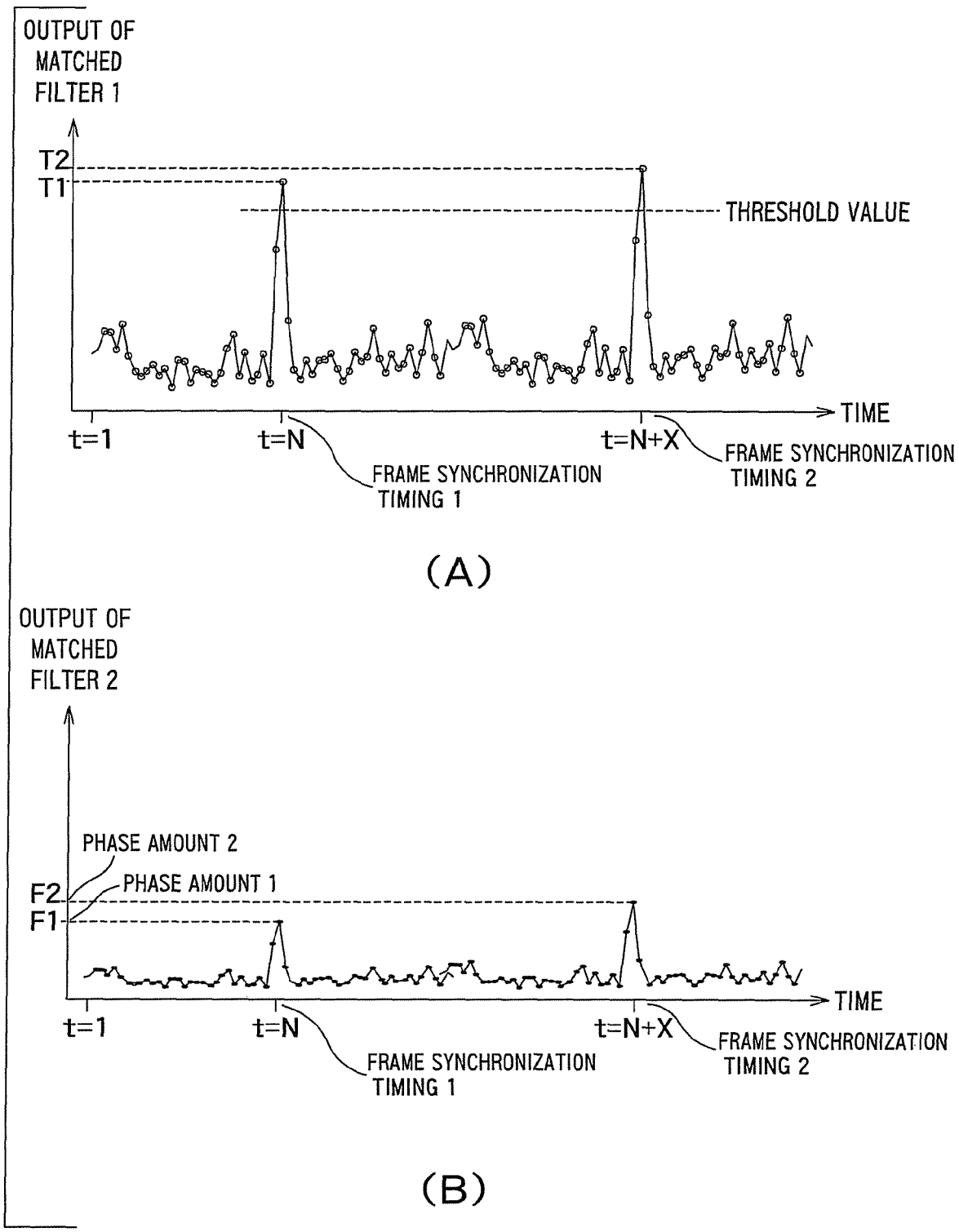
FIG. 10 is a drawing illustrating output examples of matched filters in the second embodiment.

FIGS. 10A and 10B illustrate output examples of the first and second matched filters, respectively, in the second embodiment. It is understood that two peaks appear at the same time interval (=X unit time) as that of a synchronization word within a preamble. A frame synchronization timing is identified from the output peak of the first matched filter 501 having a larger number of taps, and a phase value arg (F1) and a phase value arg (F2) are calculated from the output of the second matched filter 502 having the same matching timing. With the phase value arg (F1) and the phase value arg (F2), it is possible to calculate a phase fluctuation, i.e., a frequency offset, in a period from a first frame synchronization timing t=N to a second frame synchronization timing t=N+X.

Figure 11:
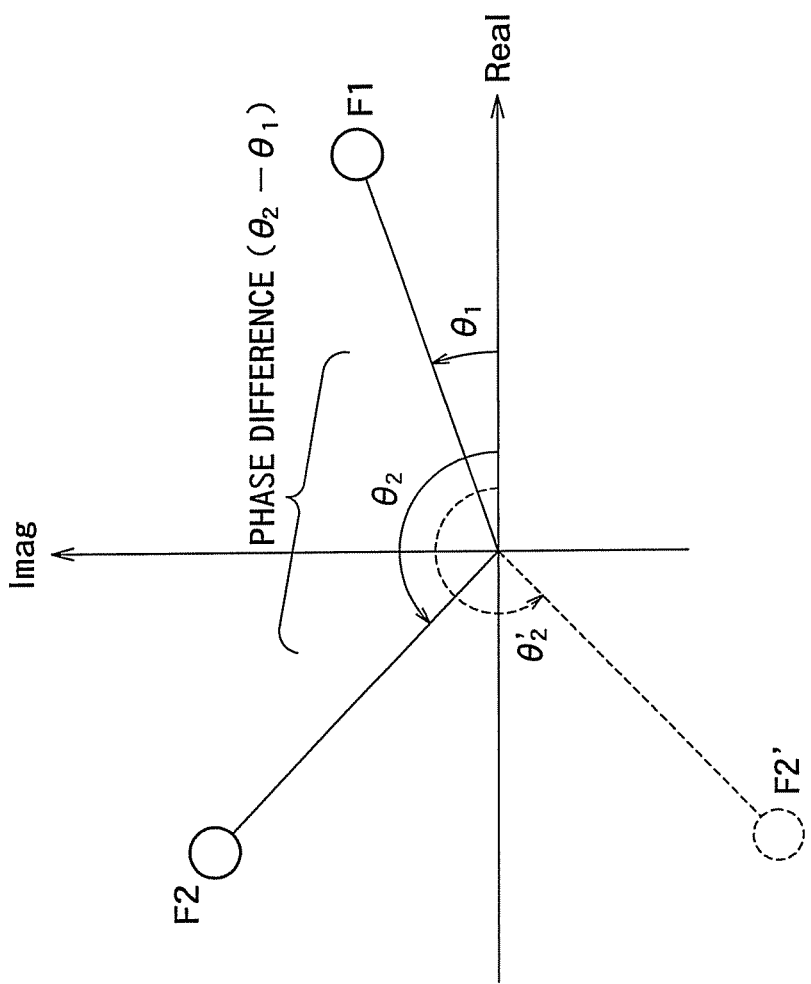
FIG. 11 is a drawing illustrating a method of frequency offset estimation in the second embodiment.

FIG. 11 illustrates a relationship between the output phase and frequency offset of the second matched filter 502. The first phase determining unit 507 calculates a phase value arg $(F1)=\theta_1$ from a complex output F1 of the second matched filter 502 at the first frame synchronization timing t=N. Likewise, the second phase determining unit 509 calculates a phase value arg $(F2)=\theta_2$ from a complex output F2 of the second matched filter 502 at the second frame synchronization timing t=N+X. The frequency offset estimating unit 510 calculates a phase fluctuation value per unit time, as a frequency offset, from a phase fluctuation $\theta_2-\theta_1$ at time interval t=X. Note that precise offset estimation is not possible if the phase fluctuation exceeds 180° as illustrated in FIG. 11. Accordingly, tap coefficients need to be set on the basis of such a time interval X at which a phase fluctuation due to a frequency offset does not exceeds 180°, while taking into consideration an assumed radio system.

In addition, the phase fluctuation may be evaluated by means of complex output multiplication processing rather than calculating the phase values arg $(F1)=\theta_1$ and the arg $(F2)=\theta_2$, respectively, as described above. In that case, the frequency offset estimating unit 510 calculates, based on a conjugate value of the complex output F1 and the complex output F2, a complex multiplication value F3=F2×conj (F1), and evaluates the phase value arg (F3) of the complex multiplication value, thereby calculating the phase fluctuation $\theta_2-\theta_1$.

Figure 12:
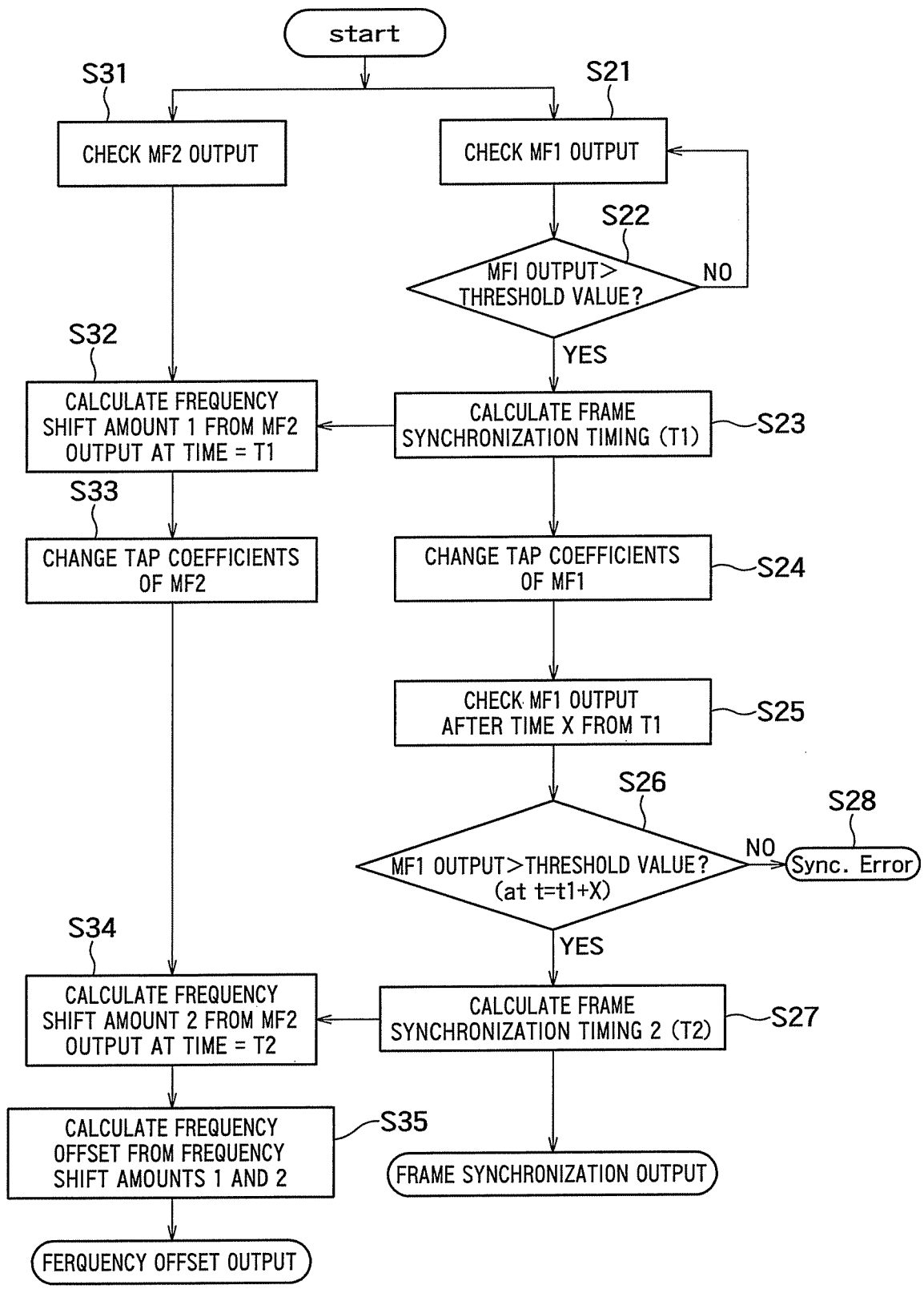
FIG. 12 is a flowchart illustrating the processing of the synchronization unit in the second embodiment.

FIG. 12 illustrates a flow of synchronization processing in the second embodiment. The synchronization unit illustrated in FIG. 8 is configured so that the first frame synchronization determining unit 506 and the second frame synchronization determining unit 508 are switched between by the first selector 503. After the detection of the first frame synchronization timing t=N (S21, S22, S23), the first selector 503 switches the output destination of the first matched filter 501 from the first frame synchronization determining unit 506 to the second frame synchronization determining unit 508. In addition, the tap coefficients of the first matched filter 501 are changed (S24).

For frame synchronization timing determination processing in the second frame synchronization determining unit 508, it is possible to utilize not only peak detection based on a threshold value but also a time elapsing from the first frame synchronization timing t=N. That is, advantage is taken of the fact that it is known from the relationship of tap coefficients illustrated in FIG. 9 that the first frame synchronization timing and the second frame synchronization timing are an X time unit away from each other. Peak detection processing at the second frame synchronization determining unit 508 may only be performed at a timing (t=N+X) having elapsed by an X unit time from the first frame synchronization timing t=N. If the output of the first matched filter 501 is greater than a threshold value at a time point of t=N+X (S25, S26, S27), the second frame synchronization determining unit 508 determines the completion of frame synchronization. Conversely, if the output is less than the threshold value, the second frame synchronization determining unit 508 can determine a frame synchronization error (false detection) (S28). Consequently, it is possible to avoid making a transition to demodulation processing with an erroneous synchronization timing kept as is. If a function to determine false detection is excluded, the processing of the second frame synchronization determining unit 508 can be made independent so as not to use information on the first frame synchronization timing (t=N). In that case, the first frame synchronization determining unit 506 and the second frame synchronization determining unit 508 share exactly the same processing, and the selector 509 becomes unnecessary. Thus, as a synchronization unit, there may be provided with either one of the synchronization determining units.

In addition, the synchronization unit illustrated in FIG. 8 is configured so that the first phase determining unit 507 and the second phase determining unit 509 are switched between by the second selector 504. The first phase determining unit 507 observes the output of the second matched filter 502 (S31), and calculates a phase value (frequency shift amount) $\theta_1$ from output data at the first frame synchronization timing t=N (S32). The second selector 504 switches the output destination of the second matched filter 502 from the first phase determining unit 507 to the second phase determining unit 509. In addition, the tap coefficient switching unit 505 changes the tap coefficients of the second matched filter 502 (S33). The second phase determining unit 509 observes the output of the second matched filter 502, and calculates a phase value (frequency shift amount) $\theta_2$ from output data at the second frame synchronization timing t=N+X (S34). The frequency offset estimating unit 510 calculates a phase fluctuation value per unit time based on the phase fluctuation $\theta_2-\theta_1$ as a frequency offset (S35).

In the second embodiment, frequency offset estimation is performed by achieving matching with synchronization words separated timewise from each other. Matched filters are diverted by switching over tap coefficients, thereby reducing a circuit scale. In addition, the tap coefficients of the second matched filter 502 are last M taps of the tap coefficients of the first matched filter 501. Accordingly, the processing of the tap coefficient switching unit 505 can be substantially realized simply by switching the coefficients of the first matched filter 501.

As has been described heretofore, according to the present embodiment, a difference from the first phase amount can be calculated by additionally providing the second phase determining unit. Consequently, it is possible to calculate the frequency offset of a received signal. In addition, the false detection of frame synchronization can be prevented by utilizing the first frame synchronization timing in the second frame synchronization determining unit, thereby improving frame synchronization performance. Yet additionally, it is possible to divert two matched filters by additionally providing the tap coefficient switching unit, thereby enabling a reduction in the circuit scale.

Embodiment 3

Figure 13:
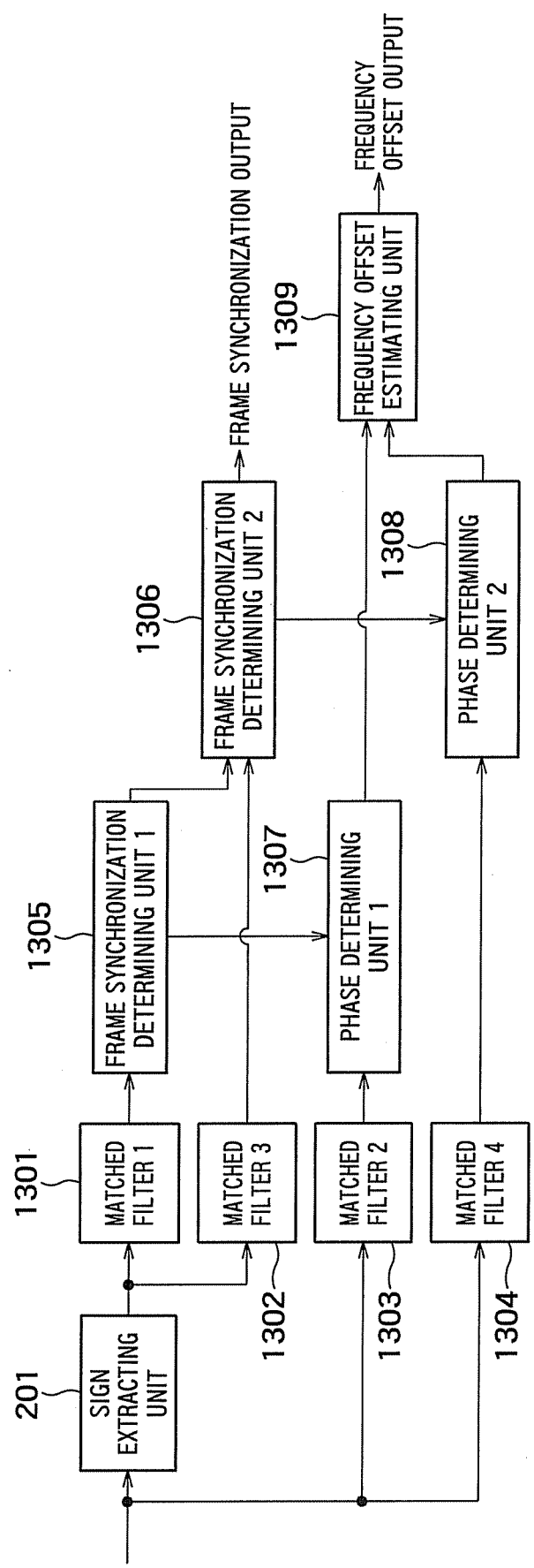
FIG. 13 is a block diagram of a synchronization unit in a third embodiment.

FIG. 13 illustrates a configuration of a synchronization unit according to Embodiment 3. The synchronization unit illustrated in FIG. 13 is provided with a first matched filter 1301 and a third matched filter 1302 for frame synchronization and a second matched filter 1303 and a fourth matched filter 1304 for phase determination. Embodiment 3 differs from the second embodiment in that the former is not configured to switch over tap coefficients but is provided with four matched filters having fixed coefficients. Since the synchronization unit does not require processing for switching over tap coefficients at high speed, it is possible to shorten a time interval between two synchronization words used to estimate a frequency offset. Synchronization processing is required to be performed in a short period of time when receiving a frame signal having a short preamble. The configuration of FIG. 13 including a plurality of matched filters having fixed tap coefficients is therefore effective. The output of the third matched filter 1302 corresponds to third output data and the output of the fourth matched filter 1304 corresponds to fourth output data.

Note that the frame synchronization determining units 1305 and 1306, the phase determining units 1307 and 1308, and the frequency offset estimating unit 1309 in FIG. 13 are the same in operation as the frame synchronization determining units 506 and 508, the phase determining units 507 and 509, and the frequency offset estimating unit 510 in FIG. 8, and therefore, the description thereof will be omitted. The frame synchronization determining unit 1306 corresponds to a third frame synchronization determining unit and the phase determining unit 1308 corresponds to a third phase determining unit.

As has been described heretofore, according to the present embodiment, a difference from the first phase amount can be calculated by additionally providing the second phase determining unit. Consequently, it is possible to calculate the frequency offset of a received signal. In addition, the false detection of frame synchronization can be prevented by utilizing the first frame synchronization timing in the second frame synchronization determining unit, thereby improving frame synchronization performance. Yet additionally, frame synchronization can be achieved even if an interval at which synchronization words to be matched with the respective matched filters are received is short, since fixed tap coefficients are separately set in the two matched filters for frame synchronization.

Embodiment 4

Figure 14:
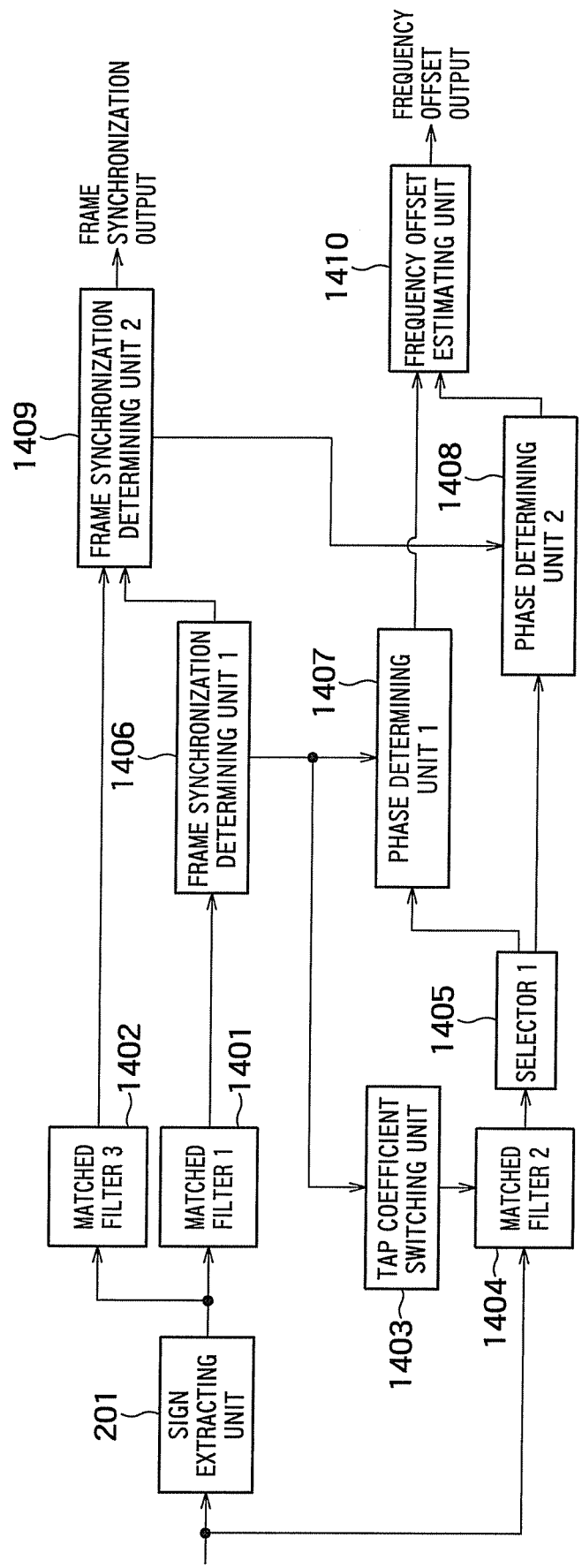
FIG. 14 is a block diagram of a synchronization unit in a fourth embodiment.

As a configuration in which a first matched filter and a second matched filter each having fixed tap coefficients are provided as matched filters configured to utilize signs only, and the tap coefficients of a matched filter configured to utilize both signs and amplitudes are switched over, a configuration illustrated in FIG. 14 is conceivable. Embodiment 4 differs from the second embodiment in that the former is provided with two matched filters (first matched filter 1401 and third matched filter 1402) for frame synchronization. A matched filter for frame synchronization has an increased number of taps in order to make output peaks larger. In return, the processing time of a preamble is prolonged. In order to serve the purpose of shortening the processing time as much as possible, the first and third matched filters having lengthened tap lengths are provided with fixed tap coefficients, and tap coefficients are switched over only for the second matched filter 1404 having a shortened tap length by using the tap coefficient switching unit 1403, thereby diverting a circuit. Although being long in tap length, the first and third matched filters 1401 and 1402 only use the signs of received signals, substantial calculations made by the matched filters are the cumulative additions/subtractions of tap coefficients. Thus, the effect of providing the synchronization unit with two matched filters upon a circuit scale is limitative.

Note that a selector 1405, phase determining units (frequency shift amount determining units) 1407 and 1408, frame synchronization determining units 1406 and 1409, and a frequency offset estimating unit 1410 are the same in operation as the frame synchronization determining units 506 and 508, the phase determining units 507 and 509, and the frequency offset estimating unit 510 in FIG. 8, and therefore, the description thereof will be omitted.

Embodiment 5

Figure 15:
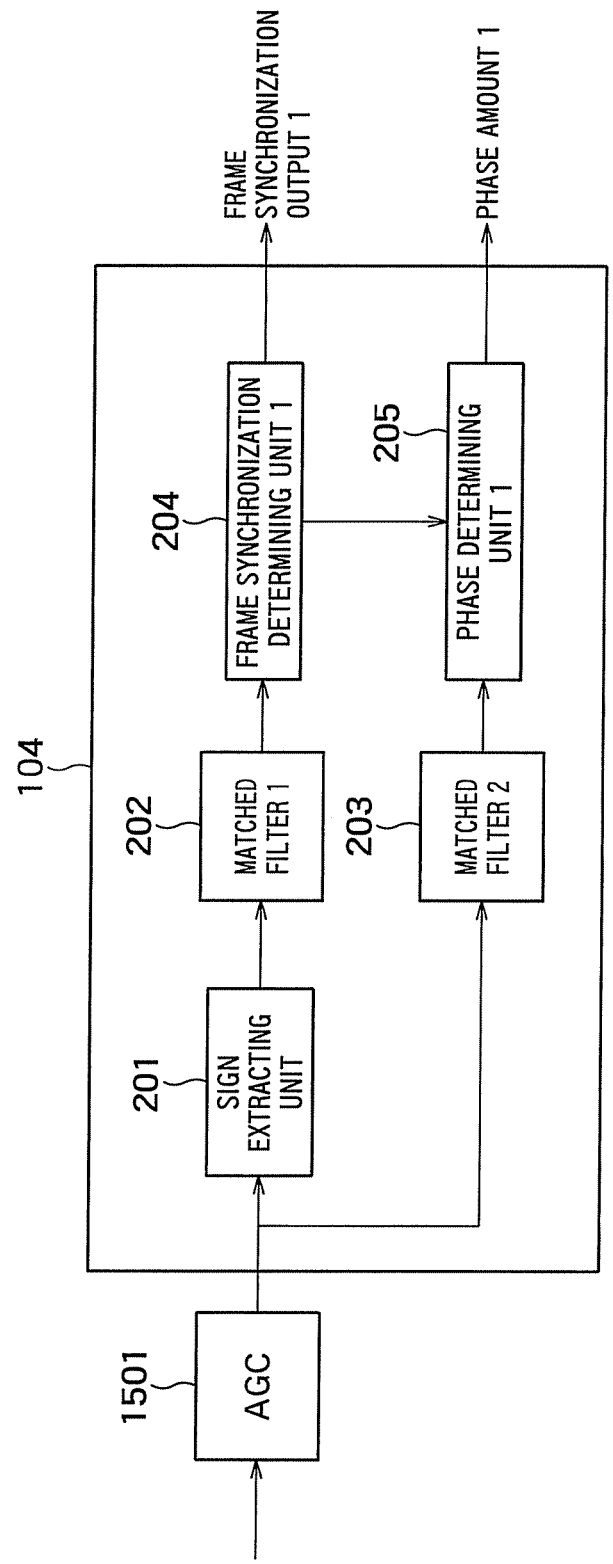
FIG. 15 is a block diagram of a synchronization unit in a fifth embodiment.

As Embodiment 5, FIG. 15 illustrates a configuration in which an AGC (Automatic Gain Controller) 1501 is provided in a stage followed by a synchronization unit 104. A received digital signal is gain-controlled to a desired level at the AGC 1501 and input to the synchronization unit 104. As a result, a received signal having desired average power is input to first and second matched filters 202 and 203. Consequently, it becomes easy to determine an output peak at the time of matching with a synchronization word. If the average power of a synchronization word contained in the received signal is known, it is possible to theoretically calculate an output value at the time of matching in the matched filters. Thus, it is possible to appropriately set a threshold value for frame synchronization.

In FIG. 15, the AGC 1501 is located immediately in front of the synchronization unit 104. Alternatively, the AGC may be located between an RF/analog unit 102 and an ADC 103 or may be built in the RF/analog unit 102 as part thereof. That is, the AGC may perform gain control in either an analog domain or a digital domain.

There may be the concern that an AGC error which causes a deviation from the desired level due to circuit incompleteness occurs in the AGC 1501. However, the present embodiment has the advantage of being highly tolerant to AGC errors.

Figure 16:
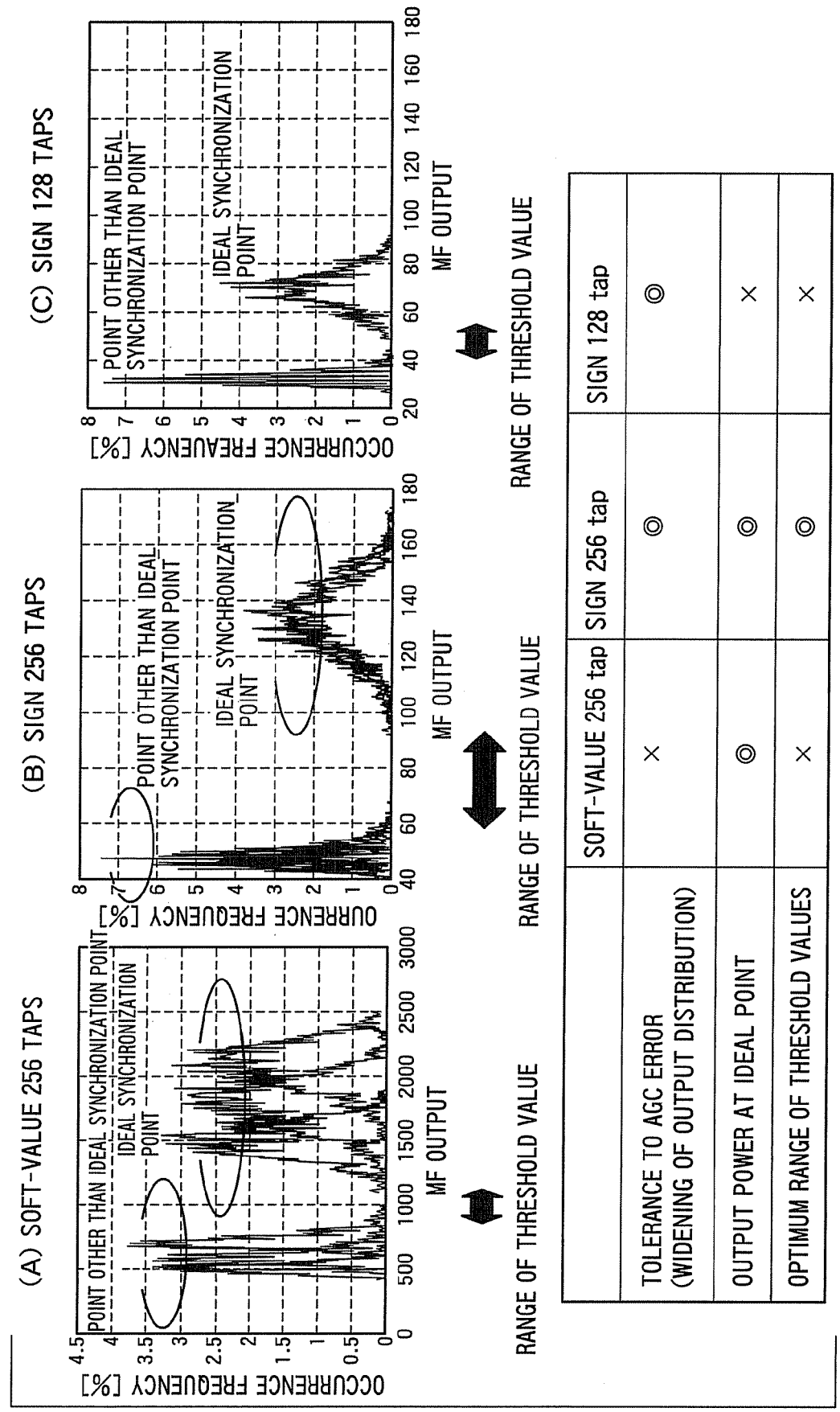
FIG. 16 is a drawing illustrating, by way of example, output distributions of matched filters in the fifth embodiment.

FIG. 16 illustrates, by way of example, matched filter output distributions under the influence of AGC errors.

FIG. 16A represents the output distributions of a matched filter (soft-value matched filter) which uses both a sign and an amplitude. FIG. 16A illustrates an output distribution at an ideal synchronization point (matching timing) and an output distribution at nonideal timings other than the synchronization point, when three types of synchronization words (having variations of +2, +0 and −2 dB) variable in average power are given as signals input to the matched filter. It is understood that output at the ideal synchronization point fluctuates due to an AGC error, and that the range of threshold values used to detect peaks narrows.

FIG. 16B illustrates like output distributions when a matched filter which uses signs only is used. It is understood that the matched filter is hardly susceptible to the effects of average power fluctuations due to an AGC error, since the matched filter uses only the sign of a received signal. It is also understood that the range of threshold values used to detect the ideal synchronization point can be widened.

FIG. 16C illustrates output distributions when the number of taps of the matched filter which uses signs only is reduced to half. It can be confirmed that as the result number of taps being reduced to half, an output level at the ideal synchronization point decreases and that the range of threshold values narrows.

According to the above-described results of analysis, a system of frame synchronization in the present embodiment operates excellently even in an environment in which gain adjustment errors are present in the AGC. Thus, it is understood that a further improvement in synchronization performance can be expected with an increase in the number of taps.

As has been described heretofore, according to the present embodiment, the matched filters can be set so that the output thereof when a synchronization word is received is at a predetermined level, by providing the AGC for gain adjustment in a stage followed by the matched filters. Consequently, frame synchronization performance is improved. In addition, since only signs are used in the first matched filter to achieve matching, the first matched filter is less susceptible to errors even if an error occurs in the gain adjustment of the AGC. Thus, it is possible to realize high-precision frame synchronization.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A radio receiver comprising:
a first matched filter configured to perform matching processing on the basis of N (N is a natural number) first tap coefficients and sign information of a received digital signal to obtain first output data;
a second matched filter configured to perform matching processing on the basis of M (M is a natural number smaller than the N) second tap coefficients, the sign information and amplitude information of the received digital to obtain second output data;
a first frame synchronization determining unit configured to determine a first frame synchronization timing of the received digital signal on the basis of the first output data; and
a first phase determining unit configured to determine a first phase amount of the received digital signal on the basis of the second output data and the first frame synchronization timing.

2. The receiver according to claim 1, further comprising:
a tap coefficient switching unit configured to change the first tap coefficients and the second tap coefficients of the first matched filter and the second matched filter after the first frame synchronization timing is determined;
a second frame synchronization determining unit configured to determine a second frame synchronization timing of the received digital signal on the basis of the changed first output data and the first frame synchronization timing;
a second phase determining unit configured to determine a second phase amount of the received digital signal on the basis of the changed second output data and the second frame synchronization timing; and
a frequency offset estimating unit configured to estimate a frequency offset based on the first phase amount and the second phase amount.

3. The receiver according to claim 2, further comprising:
a first selector configured to switch an output destination of the first matched filter from the first frame synchronization determining unit to the second frame synchronization determining unit after the first frame synchronization timing is determined; and
a second selector configured to switch an output destination of the second matched filter from the first phase determining unit to the second phase determining unit after the first frame synchronization timing is determined.

4. The receiver according to claim 1, further comprising:
a third matched filter configured to perform matching processing on the basis of N third tap coefficients and the sign information of the received digital signal to obtain third output data;
a fourth matched filter configured to perform matching processing on the basis of M fourth tap coefficients, the sign information of the received digital signal and amplitude information of the received digital signal to obtain fourth output data;

a second frame synchronization determining unit configured to determine a second frame synchronization timing of the received digital signal on the basis of the third output data and the first frame synchronization timing;

a second phase determining unit configured to determine a second phase amount of the received digital signal on the basis of the fourth output data and the second frame synchronization timing; and a frequency offset estimating unit configured to estimate a frequency offset of the received digital signal based on the first phase amount and the second phase amount.

5. The receiver according to claim 1, further comprising:

an AGC (Automatic Gain Controller) configured to control a gain of a received signal; and an A/D converter configured to convert the gain-controlled received signal to the received digital signal.

6. The receiver according to claim 1, further comprising:

an A/D converter configured to convert a received signal to the received digital signal; and an AGC configured to control a gain of the received digital signal, wherein the first matched filter and the second matched filter use the gain-controlled received digital signal.

\* \* \* \* \*